(12) United States Patent
Kurebayashi (10) Patent No.: US 10,571,581 B2
(45) Date of Patent: *Feb. 25, 2020

(54) RADIATION DETECTOR, AND METHOD FOR PRODUCING RADIATION DETECTOR

(71) Applicant: HAMAMATSU PHOTONICS K.K., Hamamatsu-shi, Shizuoka (JP)

(72) Inventor: Syouji Kurebayashi, Hamamatsu (JP)

(73) Assignee: HAMAMASTU PHOTONICS K.K., Hamamatsu-shi, Shizuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/982,771

(22) Filed: May 17, 2018

(65) Prior Publication Data

US 2018/0267179 A1 Sep. 20, 2018

Related U.S. Application Data

(63) Continuation of application No. 15/030,412, filed as application No. PCT/JP2014/077252 on Oct. 10, 2014, now Pat. No. 10,061,035.

(30) Foreign Application Priority Data

Nov. 15, 2013 (JP) .................................. 2013-236693

(51) Int. Cl.
*G01T 1/20* (2006.01)
*H01L 27/146* (2006.01)

(52) U.S. Cl.
CPC ........ *G01T 1/2018* (2013.01); *H01L 27/1462* (2013.01); *H01L 27/14618* (2013.01);
(Continued)

(58) Field of Classification Search
CPC ..... G01T 1/2018; G01T 1/20; H01L 27/1462; H01L 27/14663; H01L 27/14685
See application file for complete search history.

(56) References Cited

U.S. PATENT DOCUMENTS 6,262,422 B1* 7/2001 Homme ................ G01T 1/2018
250/367
6,278,118 B1 8/2001 Homme et al.
(Continued)

FOREIGN PATENT DOCUMENTS

CN 1220732 A 6/1999
CN 1309777 A 8/2001
(Continued)

OTHER PUBLICATIONS

International Preliminary Report on Patentability dated May 26, 2016 for PCT/JP2014/077252.
(Continued)

*Primary Examiner* — Frederick B Hargrove
(74) *Attorney, Agent, or Firm* — Drinker Biddle & Reath LLP (57) ABSTRACT

A radiation detector has a photoelectric conversion element array having a light receiving unit and a plurality of bonding pads; a scintillator layer stacked on the photoelectric conversion element array; a resin frame formed on the photoelectric conversion element array so as to pass between the scintillator layer and the bonding pads away from the scintillator layer and the bonding pads and so as to surround the scintillator layer; and a protection film covering the scintillator layer and having an outer edge located on the resin frame; a first distance between an inner edge of the resin frame and an outer edge of the scintillator layer is shorter than a second distance between an outer edge of the resin frame and an outer edge of the photoelectric conversion element array; the outer edge and a groove are processed with a laser beam.

5 Claims, 8 Drawing Sheets

(52) U.S. Cl.
CPC .. *H01L 27/14629* (2013.01); *H01L 27/14636* (2013.01); *H01L 27/14663* (2013.01); *H01L 27/14685* (2013.01)

(56) References Cited

U.S. PATENT DOCUMENTS

| | | | |
|---|---|---|---|
| 6,407,360 B1* | 6/2002 | Choo | B23K 26/046 219/121.67 |
| 7,828,926 B1 | 11/2010 | Gaysinskiy | |
| 10,061,035 B2* | 8/2018 | Kurebayashi | G01T 1/2018 |
| 2005/0092927 A1* | 5/2005 | Nagano | G01T 1/2928 250/370.11 |
| 2006/0033031 A1 | 2/2006 | Takeda et al. | |
| 2012/0288688 A1* | 11/2012 | Kug | G21K 4/00 428/177 |
| 2013/0168555 A1* | 7/2013 | Moon | H01L 27/14676 250/361 R |
| 2014/0008749 A1 | 1/2014 | Nomura et al. | |
| 2014/0162408 A1* | 6/2014 | Brunton | H01L 27/3204 438/113 |

FOREIGN PATENT DOCUMENTS

| | | |
|---|---|---|
| CN | 102779565 A | 11/2012 |
| JP | 3077941 B2 | 8/2000 |
| JP | 2004-264239 A | 9/2004 |
| JP | 2004-317167 A | 11/2004 |
| JP | 2005-144973 A | 6/2005 |
| JP | 2005-338067 | 12/2005 |
| JP | 2006-052981 A | 2/2006 |
| JP | 2006-052985 A | 2/2006 |
| JP | 2009-260017 | 11/2009 |
| JP | 2010-046757 | 3/2010 |
| JP | 2010-118602 A | 5/2010 |
| JP | 2012-023335 | 2/2012 |
| JP | 2012-185123 A | 9/2012 |
| JP | 2013-117547 A | 6/2013 |
| KR | 2011-0113482 | 10/2011 |
| WO | WO 98/36291 A1 | 8/1998 |

OTHER PUBLICATIONS

United States Patent and Trademark Office, Non-Final Office Action for U.S. Appl. No. 15/982,705, dated Sep. 20, 2018.

* cited by examiner

RADIATION DETECTOR, AND METHOD FOR PRODUCING RADIATION DETECTOR

This is a continuation application of copending application Ser. No. 15/030,412, having a § 371 date of Apr. 19, 2016, which is a national stage filing based on PCT International Application No. PCT/JP2014/077252 filed on Oct. 10, 2014. The copending application Ser. No. 15/030,412 is incorporated by reference herein in its entirety.

TECHNICAL FIELD

The present invention relates to a radiation detector, and a method for producing the radiation detector.

BACKGROUND ART

There is a conventionally known radiation detector (radiation detection element) in which a scintillator layer of a columnar crystal structure is formed on a sensor panel (light receiving unit), as described in Patent Literature 1 below. In this radiation detector, a plurality of bonding pads electrically connected to light receiving elements are arranged outside the light receiving unit. When viewed from a stacking direction of the scintillator layer, a resin frame is formed so as to pass between the scintillator layer and the bonding pads and surround the scintillator layer. The scintillator layer is covered by a moisture-resistant protection film and the outer edge of the moisture-resistant protection film lies onto the resin frame.

Radiation detection devices with such a radiation detector are in demand as portable devices, in addition to stationary devices. Accordingly, there is a need for reduction in size and weight of the radiation detection devices. For this reason, the radiation detector forming the radiation detection device is required to reduce its size and weight. For reducing the size of the radiation detector, it is preferable to make the size of the resin frame as small as possible and the distance between the resin frame and the outer edge of the scintillator layer as short as possible, thereby maximizing the area of the scintillator layer (effective area) in the region inside the resin frame.

CITATION LIST

Patent Literature

Japanese Patent No. 3077941

SUMMARY OF INVENTION

Technical Problem

Incidentally, in a process of producing the radiation detector described in above Patent Literature 1, the moisture-resistant protection film formed on the resin frame is cut along the resin frame with a cutter. However, a considerable degree of proficiency is required for the work of cutting the moisture-resistant protection film with the cutter, while making the resin frame smaller and the distance between the resin frame and the outer edge of the scintillator layer shorter, and, therefore, there is room for improvement in terms of productivity and production cost.

It is therefore an object of the present invention to provide a radiation detector achieving both of the reduction in size of the device and the increase in effective area of the scintillator layer and improving productivity, and a production method thereof.

Solution to Problem

A radiation detector according to one aspect of the present invention comprises: a photoelectric conversion element array having a light receiving unit including a plurality of photoelectric conversion elements one-dimensionally or two-dimensionally arrayed, and a plurality of bonding pads electrically connected to the photoelectric conversion elements and arranged outside the light receiving unit; a scintillator layer stacked on the photoelectric conversion element array so as to cover the light receiving unit and configured to convert radiation into light; a resin frame formed on the photoelectric conversion element array, when viewed from a stacking direction of the scintillator layer, so as to pass between the scintillator layer and the bonding pads away from the scintillator layer and the bonding pads and so as to surround the scintillator layer; and a protection film covering the scintillator layer and having an outer edge located on the resin frame, wherein a first distance between an inner edge of the resin frame and an outer edge of the scintillator layer is shorter than a second distance between an outer edge of the resin frame and an outer edge of the photoelectric conversion element array; and wherein the outer edge of the protection film and a corresponding region of the resin frame corresponding to the outer edge of the protection film are in a processed state with a laser beam.

In the radiation detector according to the one aspect of the present invention, the protection film on the resin frame is processed with the laser beam. Since the processing with the laser beam requires no proficient technique in comparison with the cutting with the cutter, it can improve productivity. Since the protection film can be accurately cut with the laser beam, the resin frame can be made smaller. Since the resin frame is formed away from the scintillator layer and the bonding pads, an adverse effect of the laser beam on the scintillator layer and bonding pads during production can be suppressed. On the other hand, as the resin frame is located close to the scintillator layer, an increase in effective area of the scintillator layer is also achieved. Therefore, the radiation detector according to the one aspect of the present invention can achieve both of the reduction in size of the device and the increase in effective area of the scintillator layer and improve productivity.

In the foregoing radiation detector, the outer edge of the protection film and the corresponding region may be finely corrugated when viewed from the stacking direction. In cases such as a case where the protection film on the resin frame is covered by a coating resin, this configuration increases a contact area of the outer edge of the protection film and the corresponding region with the coating resin and thus it can make firmer adhesion of the outer edge of the protection film and the corresponding region to the coating resin.

In the foregoing radiation detector, a height of the corresponding region may be not more than one third of a height of the resin frame. This can more effectively suppress an adverse effect of the laser beam on the photoelectric conversion element array located below the resin frame.

In the foregoing radiation detector, a ratio of the second distance to the first distance may be not less than 5. The setting of the ratio in this way more effectively makes it feasible to suppress the adverse effect of the laser beam on the bonding pads during production and to achieve the reduction in size of the device, while securing the satisfactory effective area of the scintillator layer.

In the foregoing radiation detector, the resin frame may be formed so that a central portion thereof is higher than two edge portions thereof and a height of the resin frame may be lower than a height of the scintillator layer. This can make the resin frame smaller and more effectively suppress the adverse effect of the laser beam on the scintillator layer during production.

In the foregoing radiation detector, a width between the inner edge of the resin frame and the outer edge of the resin frame may be not more than 900 µm and the height of the resin frame may he not more than 450 µm. This can make the resin frame smaller, thereby achieving further reduction in size of the device while securing the satisfactory effective area of the scintillator layer.

In the foregoing radiation detector, the outer edge of the protection film and the corresponding region processed with the laser beam may be formed in a substantially rectangular ring shape with arcuate corners convex outward, when viewed from the stacking direction. In the above radiation detector, the corners of the protection film (corner portions at the four corners) are formed in the arcuate shape convex outward (so-called R shape), whereby the protection film can be prevented from peeling off the resin frame at the corners.

The foregoing radiation detector may further comprise a coating resin layer arranged along the resin frame so as to cover the outer edge of the protection film. As the radiation detector comprises this coating resin layer, the outer edge of the protection film can be fixed as sandwiched between the resin frame and the coating resin layer. This can prevent the protection film from peeling off the resin frame, at the outer edge of the protection film.

In the foregoing radiation detector, a peripheral portion of the scintillator layer may be formed in a taper shape with heights gradually decreasing toward the outside of the scintillator layer. When the peripheral portion of the scintillator layer is configured with the heights decreasing toward the outside in this manner, a region of the scintillator layer subject to the adverse effect of the laser beam during production can be limited.

In the foregoing radiation detector, the protection film may include a metal film to reflect light. This can prevent light generated in the scintillator layer from leaking to the outside, which can improve the detection sensitivity of the radiation detector.

A method for producing a radiation detector according to one aspect of the present invention comprises: a step of preparing a photoelectric conversion element array having a light receiving unit including a plurality of photoelectric conversion elements one-dimensionally or two-dimensionally arrayed, and a plurality of bonding pads electrically connected to the photoelectric conversion elements and arranged outside the light receiving unit, and stacking a scintillator layer for converting radiation into light, on the photoelectric conversion element array so as to cover the light receiving unit; a step of forming a resin frame on the photoelectric conversion element array, when viewed from a stacking direction of the scintillator layer, so as to pass between the scintillator layer and the bonding pads away from the scintillator layer and the bonding pads and so as to surround the scintillator layer; a step of forming a protection film so as to cover an entire surface at least on a side where the scintillator layer is stacked on the photoelectric conversion element array; and a step of irradiating the protection film along the resin frame with a laser beam to cut the protection film, thereby removing an outside portion of the protection film, wherein in the step of forming the resin frame, the resin frame is formed so that a first distance between an inner edge of the resin :frame and an outer edge of the scintillator layer is shorter than a second distance between an outer edge of the resin frame and an outer edge of the photoelectric conversion element array.

In the method for producing the radiation detector according to the one aspect of the present invention, since the protection film on the resin frame is cut with the laser beam, the processing requires no proficient technique in comparison with the cutting with the cutter, and thus it can improve productivity. Since the protection film can be accurately cut with the laser beam, the resin frame can be made smaller. Since the resin frame is formed away from the scintillator layer and bonding pads, it can suppress the adverse effect of the laser beam on the scintillator layer and bonding pads during the cutting of the protection film. On the other hand, as the resin frame is located close to the scintillator layer, an increase in effective area of the scintillator layer is also achieved.

Advantageous Effects of Invention

The one aspect of the present invention can provide the radiation detector achieving both of the reduction in size of the device and the increase in effective area of the scintillator layer and improving the productivity, and the production method thereof.

DESCRIPTION OF EMBODIMENTS

An embodiment of the present invention will be described below with reference to the drawings. The same portions will be denoted by the same reference signs, without redundant description, as much as possible. It is noted that dimensions and sizes in each drawing are not always identical with actual ones.

Figure 1:
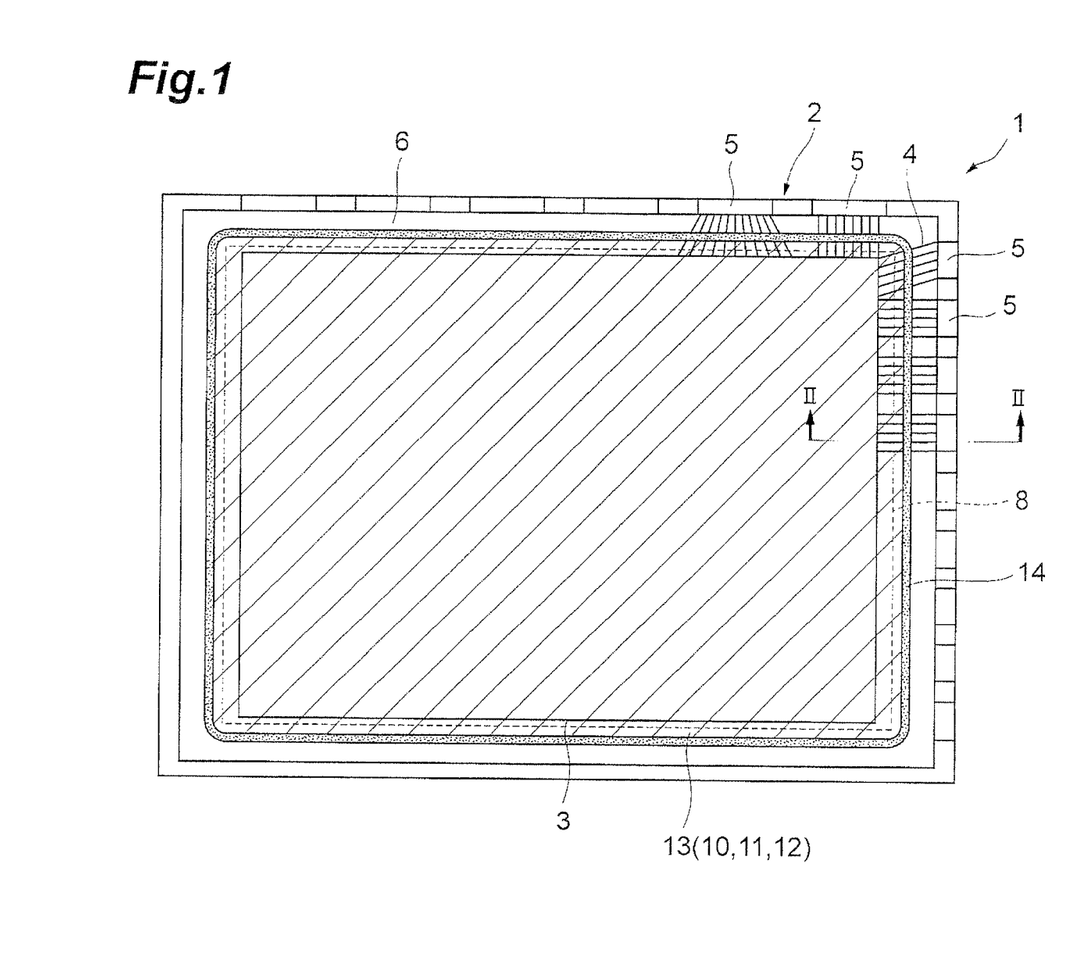
FIG. 1 is a plan view of a radiation detector according to one embodiment of the present invention.
Figure 2:
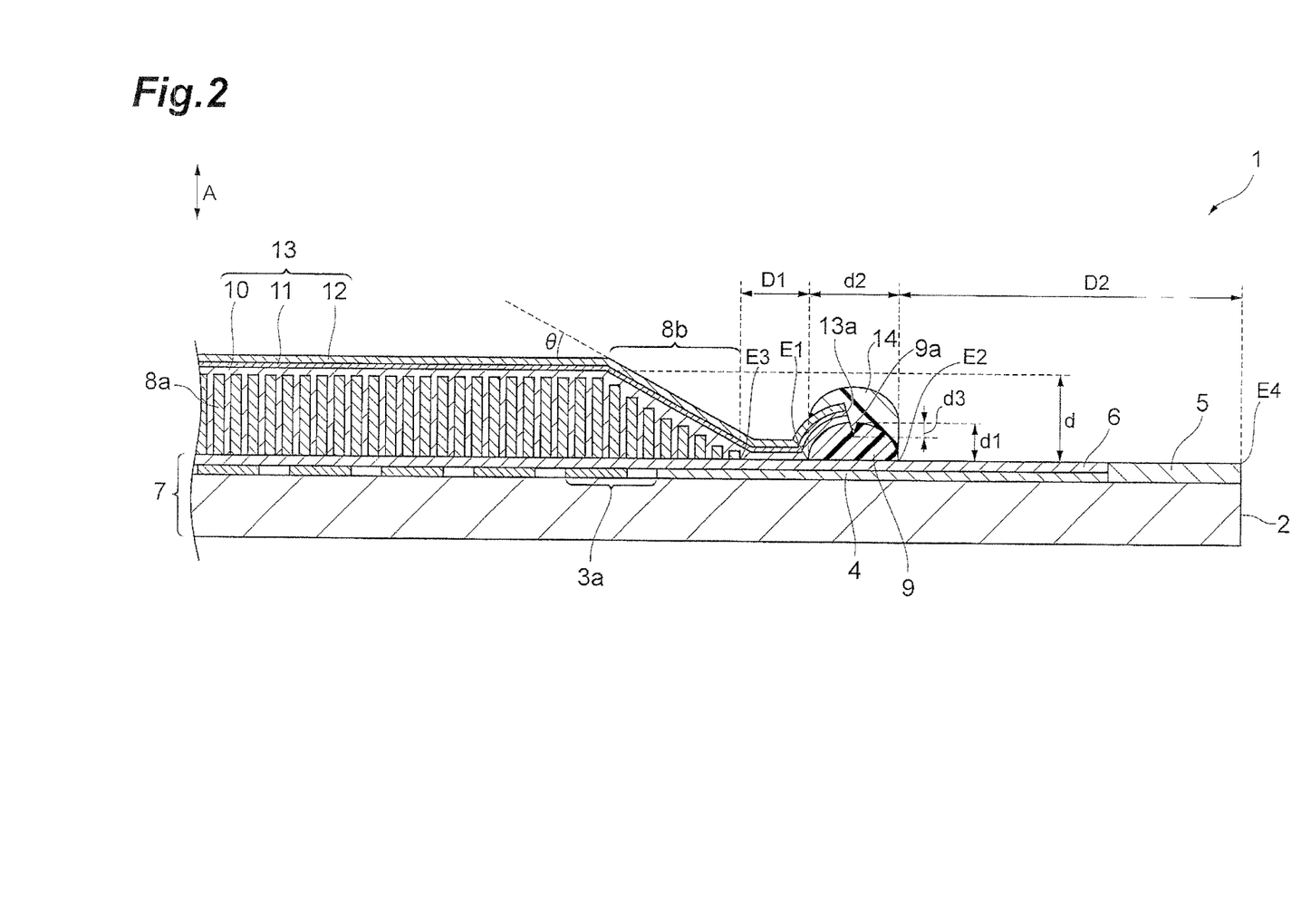
FIG. 2 is a cross-sectional view along the line II-II in FIG. 1.

First, the configuration of the radiation detector 1 according to the present embodiment will be described with reference to FIGS. 1 and 2. As shown in FIGS. 1 and 2, the radiation detector 1 has a photoelectric conversion element array 7, a scintillator layer 8, a resin frame 9, a protection film 13, and a coating resin layer 14. The photoelectric conversion element array 7 has a substrate 2, a light receiving unit 3, signal lines 4, bonding pads 5, and a passivation film 6. The protection film 13 has a first organic film 10, an inorganic film (metal film) 11, and a second organic film 12.

The light receiving unit 3 is configured including a plurality of photoelectric conversion elements 3a two-dimensionally arrayed in a rectangular region in a central portion of the insulating substrate 2 (e.g., a glass substrate). Each photoelectric conversion element 3a is comprised of a photodiode (PD) of amorphous silicon, a thin film transistor (TFT), and so on. The photoelectric conversion elements 3a in each row or in each column in the light receiving unit 3 are electrically connected each to the bonding pad 5 for extracting signals to an external circuit (not shown), through the signal line 4 for signal readout.

The bonding pads 5 are arranged so that a plurality of bonding pads 5 are located at predetermined intervals along two neighboring sides (the upper side and right side in FIG. 1) of the outer edge of the substrate 2, and are electrically connected through the signal lines 4 to the corresponding photoelectric conversion elements 3a. The insulating passivation film 6 is formed on the photoelectric conversion elements 3a and signal lines 4. This passivation film 6 can be made, for example, using silicon nitride, silicon oxide, or the like. The bonding pads 5 are exposed for connection to the external circuit.

Scintillators 8a of a columnar structure for converting X-rays (radiation) into light are stacked on the photoelectric conversion element array 7 so as to cover the light receiving unit 3. A plurality of scintillators 8a are stacked in a substantially rectangular region (region encircled by a dashed line in FIG. 1) including the light receiving unit 3 in the photoelectric conversion element array 7, thereby forming the scintillator layer 8. The scintillators 8a can be made using various materials and, for example, using thallium (Tl)-doped cesium iodide (CsI) with good emission efficiency.

A peripheral portion 8b of the scintillator layer 8 is formed in a taper shape with heights gradually decreasing toward the outside of the scintillator layer 8. Namely, in the peripheral portion 8b, the closer to the outside of the scintillator layer 8 the scintillator 8a is located, the lower the height thereof. The peripheral portion 8b herein is a region under which the light receiving unit 3 is not formed (a region outside an effective screen), or a region with little influence on X-ray image generation. Therefore, by providing this peripheral portion 8b of the taper shape, it is feasible to limit a region on the scintillator layer 8 subject to the adverse effect of the laser beam during production. Here, an inclination angle of the peripheral portion 8b, i.e., an angle θ of a straight line connecting the height positions of the scintillators 8a formed in the peripheral portion 8b from inside to outside of the scintillator layer 8, relative to the top surface of the substrate 2 is included in the range of 20° to 80°.

The resin frame 9 is formed on the photoelectric conversion element array 7, when viewed from a stacking direction A of the scintillator layer 8, so as to pass between the scintillator layer 8 and the bonding pads 5 and surround the scintillator layer 8. The corners of the resin frame 9 are made in an arcuate shape (so-called R shape) convex outward. The resin frame 9 is, for example, a silicone resin.

The resin frame 9 is formed so that a central portion thereof is higher than two edge portions thereof, and a height d1 of the resin frame 9 is lower than a height d of the scintillator layer 8. This can make the size of the resin frame 9 smaller and suppress the adverse effect of the laser beam on the scintillator layer 8 during production. Here, the height d1 of the resin frame 9 is a distance between the position of the top surface of the photoelectric conversion element array 7 and the position of the top of the resin frame 9 and the height d of the scintillator layer 8 is a maximum height of the scintillators 8a included in the scintillator layer 8.

The resin frame 9 is preferably made as small as possible, from the viewpoint of making the size of the radiation detector 1 smaller. More specifically, the height d1 of the resin frame 9 is preferably not more than 450 μm and a width d2 of the resin frame 9 is preferably not more than 900 μm. The width d2 of the resin frame 9 herein is a width between an inner edge E1 of the resin frame 9 (the edge on the scintillator layer 8 side) and an outer edge E2 of the resin frame 9 (the edge on the bonding pad 5 side).

A distance (first distance) D1 between the inner edge E1 of the resin frame 9 and an outer edge E3 of the scintillator layer 8 is shorter than a distance (second distance) D2 between the outer edge E2 of the resin frame 9 and an outer edge E4 of the photoelectric conversion element array 7. From the viewpoints of suppressing the adverse effect of the laser beam on the bonding pads 5 during production and ensuring the satisfactory effective area of the scintillator layer 8, a ratio of the second distance D2 to the first distance D1 is preferably not less than 5. More specifically, the first distance D1 is preferably not more than 1 mm and the second distance D2 is preferably not less than 5 mm. The reason for it is as follows.

If there were no clearance between the outer edge E3 of the scintillator layer 8 and the inner edge E1 of the resin frame 9, the effective area of the scintillator layer 8 could be maximized. However, when consideration is given to the adverse effect of the laser beam on the scintillator layer 8 during production and a slight possibility of failure in a step of forming the resin frame 9 (e.g., a situation of forming the resin frame 9 on the scintillator layer 8), the first distance D1 is preferably secured in the range of not more than 1 mm. When the second distance D2 is not less than 5 mm, a sufficient distance can be secured between the resin frame 9 and the bonding pads 5, in consideration of the adverse effect of the laser beam on the bonding pads 5 during production.

The scintillator layer 8 is covered by the protection film 13. The protection film 13 is formed by stacking the first organic film 10, inorganic film 11, and second organic film 12 in this order from the scintillator layer 8 side. All of the first organic film 10, inorganic film 11, and second organic film 12 have properties of transparency to X-rays (radiation) and impermeableness to water vapor. Specifically, the first organic film 10 and second organic film 12 can be made using poly-para-xylylene resin, poly-para-chloro-xylylene, or the like. The inorganic film 11 may be one transparent, opaque, or reflective to light and the inorganic film 11 can be made, e.g., using an oxide film of silicon (Si), titanium (Ti), or chromium (Cr), or, a metal film of gold, silver, or aluminum (Al). When a metal film to reflect light is used as the inorganic film 11, it can prevent fluorescence generated in the scintillators 8a from leaking to the outside, thereby improving the detection sensitivity of the radiation detector 1. The present embodiment will be described using an example in which Al easy to form is used as the inorganic film 11. Al itself is easy to corrode in air, but the inorganic film 11 is sandwiched between the first organic film 10 and the second organic film 12, so as to be protected from corrosion.

The protection film 13 is formed, for example, by a CVD method. For this reason, in a state immediately after formation of the protection film 13, the protection film 13 is formed so as to cover the entire surface of the photoelectric conversion element array 7. Therefore, in order to expose the bonding pads 5, the protection film 13 is cut at a position inside the bonding pads 5 on the photoelectric conversion element array 7, to remove the outside protection film 13. As described below, the protection film 13 is cut (or processed) near a central portion of the resin frame 9 with a laser beam and an outer edge 13a of the protection film 13 is fixed by the resin frame 9. This can prevent the protection film 13 from peeling off at the outer edge 13a. Here, the cutting of the protection film 13 can be implemented, for example, using a carbon dioxide laser ($CO_2$ laser), an ultrashort pulsed (nanosecond or picosecond) semiconductor laser, or the like. Use of the carbon dioxide laser enables the protection film 13 to be cut by a single scan operation (in short time), thereby improving productivity. The adverse effect on the photoelectric conversion element array 7, bonding pads 5, scintillator layer 8, and others is thermal damage, for example, with use of the carbon dioxide laser or the ultrashort pulsed laser.

The outer edge 13a of the protection film 13 is located on the resin frame 9 and is coated, together with the resin frame 9, with the coating resin layer 14 arranged along the resin frame 9. The coating resin layer 14 can be made using a resin with good adhesion to the protection film 13 and resin frame 9, e.g., such as an acrylic adhesive. The coating resin layer 14 may be made using the same silicone resin as the resin frame 9. Alternatively, the resin frame 9 may be made using the same acrylic adhesive as the coating resin layer 14.

Figure 3:
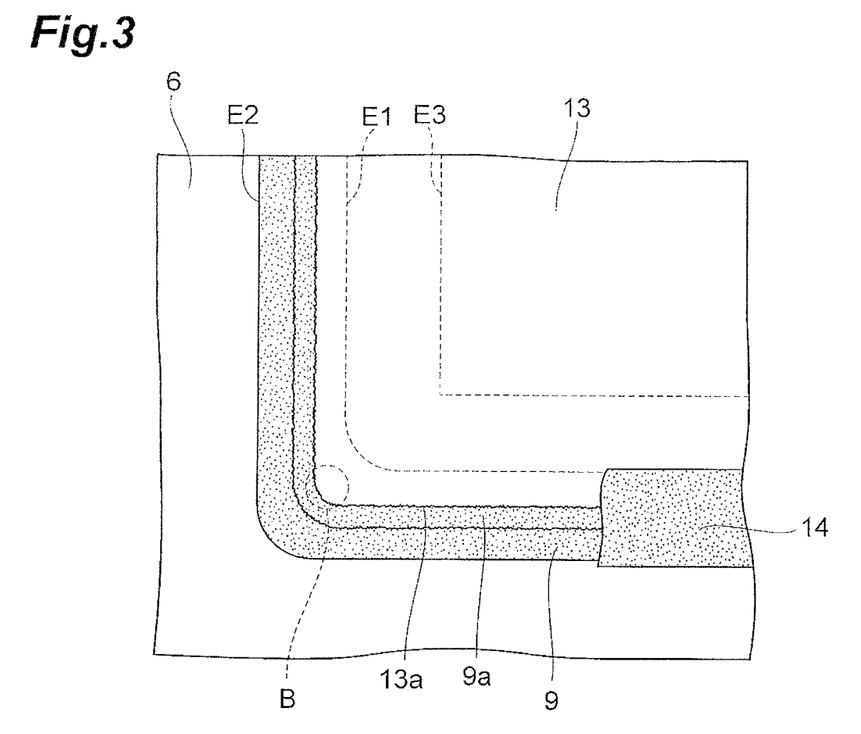
FIG. 3 is an enlarged plan view of a region near a corner of the radiation detector of FIG. 1.

Next, the corners (corner portions) of the resin frame 9 and protection film 13 will be described with reference to FIG. 3. In FIG. 3, illustration of the coating resin layer 14 is partly omitted, for easier understanding of the state of the corners of the resin frame 9 and protection film 13.

Although details will be described later, the protection film 13 on the resin frame 9 is irradiated with a laser beam in a production step of the radiation detector 1, thereby cutting away a part of the protection film 13 irradiated with the laser beam. Since the protection film 13 is very thin, a part of the resin frame 9 is also cut away with the laser beam of the carbon dioxide laser. This forms a groove (corresponding region) 9a near the center of the resin frame 9. The outer edge 13a of the protection film 13 and the groove 9a of the resin frame 9 corresponding to the outer edge 13a of the protection film 13 are in a processed state with the laser beam. Here, a depth (height) d3 of the groove 9a is not more than one third of the height d1 of the resin frame 9. This suppresses the adverse effect of the laser beam on the photoelectric conversion element array 7 located below the resin frame 9.

As shown in FIG. 3, the outer edge 13a of the protection film 13 and the groove 9a processed with the laser beam, when viewed from the stacking direction A of the scintillator layer 8, are formed in a substantially rectangular ring shape with arcuate corners (cf. region B shown in FIG. 3) convex outward. Furthermore, when viewed from the stacking direction A, the outer edge 13a of the protection film 13 and the groove 9a are finely corrugated. Namely, the surfaces of the outer edge 13a of the protection film 13 and the groove 9a, different from flat cut faces made with a knife such as a cutter, have a finely concave-convex shape. This increases a contact area of the outer edge 13a of the protection film 13 and the groove 9a with the coating resin layer 14, which can make firmer adhesion of the outer edge 13a of the protection film 13 and the groove 9a to the coating resin layer 14.

Figure 4:
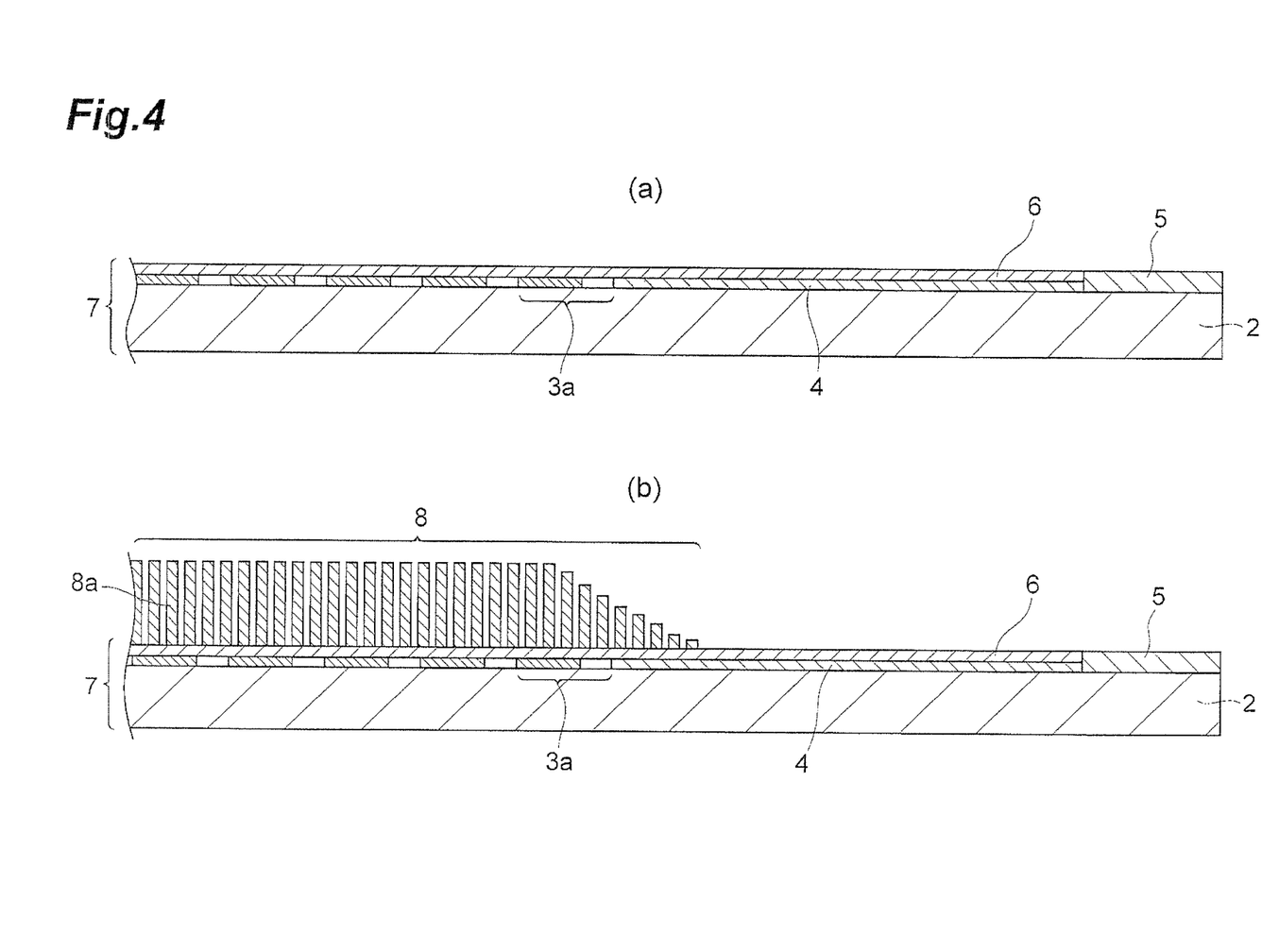
FIG. 4 is cross-sectional views showing (a) a state before formation of a scintillator layer and (b) a state after formation of the scintillator layer in steps of producing the radiation detector of FIG. 1.

Next, a method for producing the radiation detector 1 according to the present embodiment will be described with reference to FIGS. 4 to 8. First, as shown in FIG. 4(a), the photoelectric conversion element array 7 is prepared. Subsequently, as shown in FIG. 4(b), columnar crystals of Tl-doped CsI are grown to the thickness of about 600 μm in a region covering the light receiving unit 3 on the photoelectric conversion element array 7, for example, by evaporation, thereby forming (or stacking) the scintillator layer 8 thereon.

Figure 5:
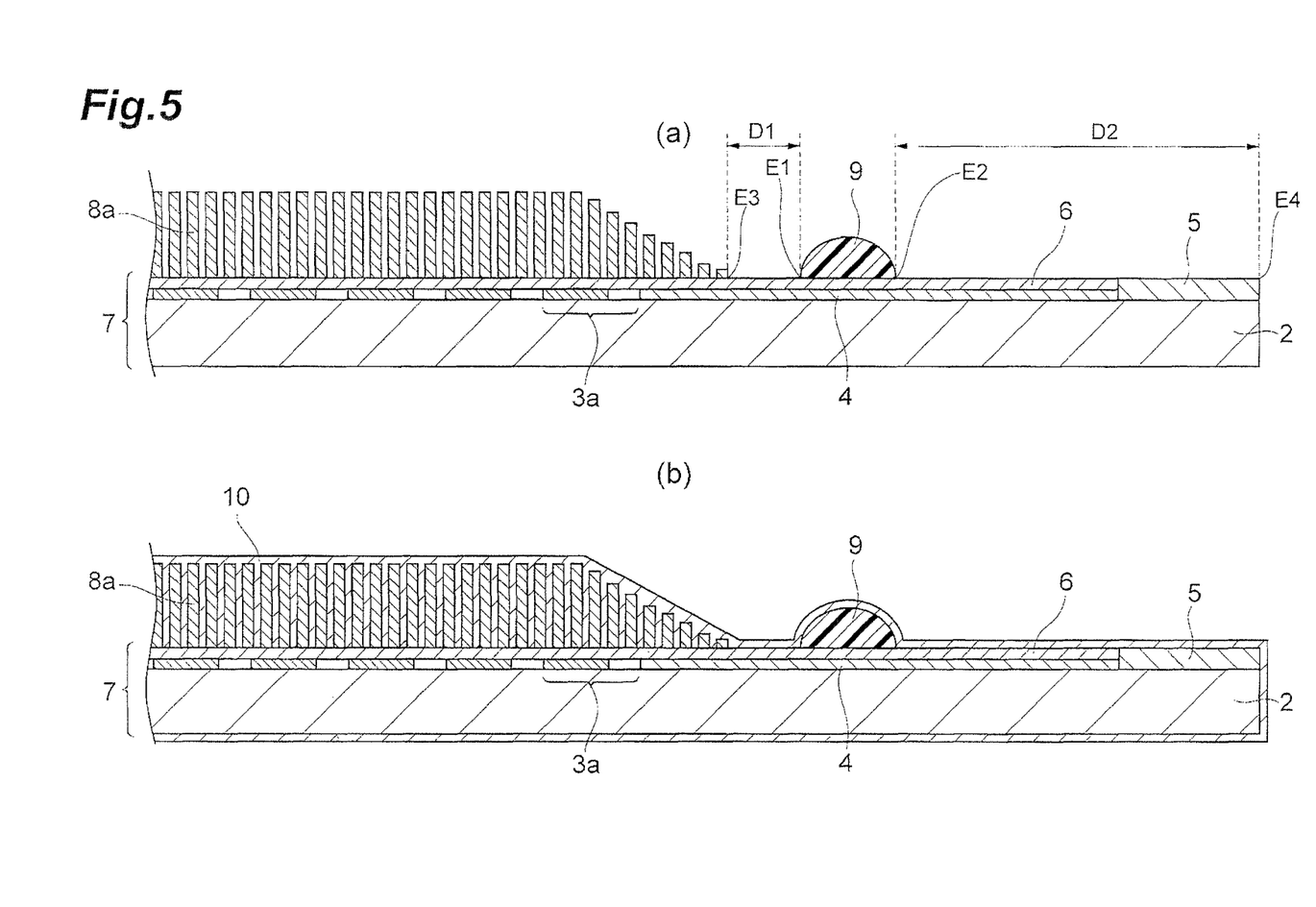
FIG. 5 is cross-sectional views showing (a) a state after formation of a resin frame and (b) a state after formation of a first organic film in steps of producing the radiation detector of FIG. 1.

Then, as shown in FIG. 5(a), the resin frame 9 is formed on the photoelectric conversion element array 7. Specifically, when viewed from the stacking direction A of the scintillator layer 8, the resin frame 9 is formed so as to pass between the scintillator layer 8 and the bonding pads 5 and surround the scintillator layer 8. More specifically, the resin frame 5 is formed at such a position that the first distance D1 is not more than 1 mm and that the second distance D2 is not less than 5 mm. The resin frame 9 can be formed, for example, using an automatic X-Y coating device. For the purpose of illustration, a lamination in which the scintillator layer 8 and resin frame 9 are formed on the photoelectric conversion element array 7 will be referred to hereinafter simply as "substrate."

CsI making up the scintillator layer 8 is highly hygroscopic and, if kept exposed, it will absorb moisture in air to dissolve. For this reason, the entire surface of the substrate is coated with poly-para-xylylene in the thickness of 5 to 25 μm, for example, by a CVD method. This forms the first organic film 10, as shown in FIG. 5(b).

Figure 6:
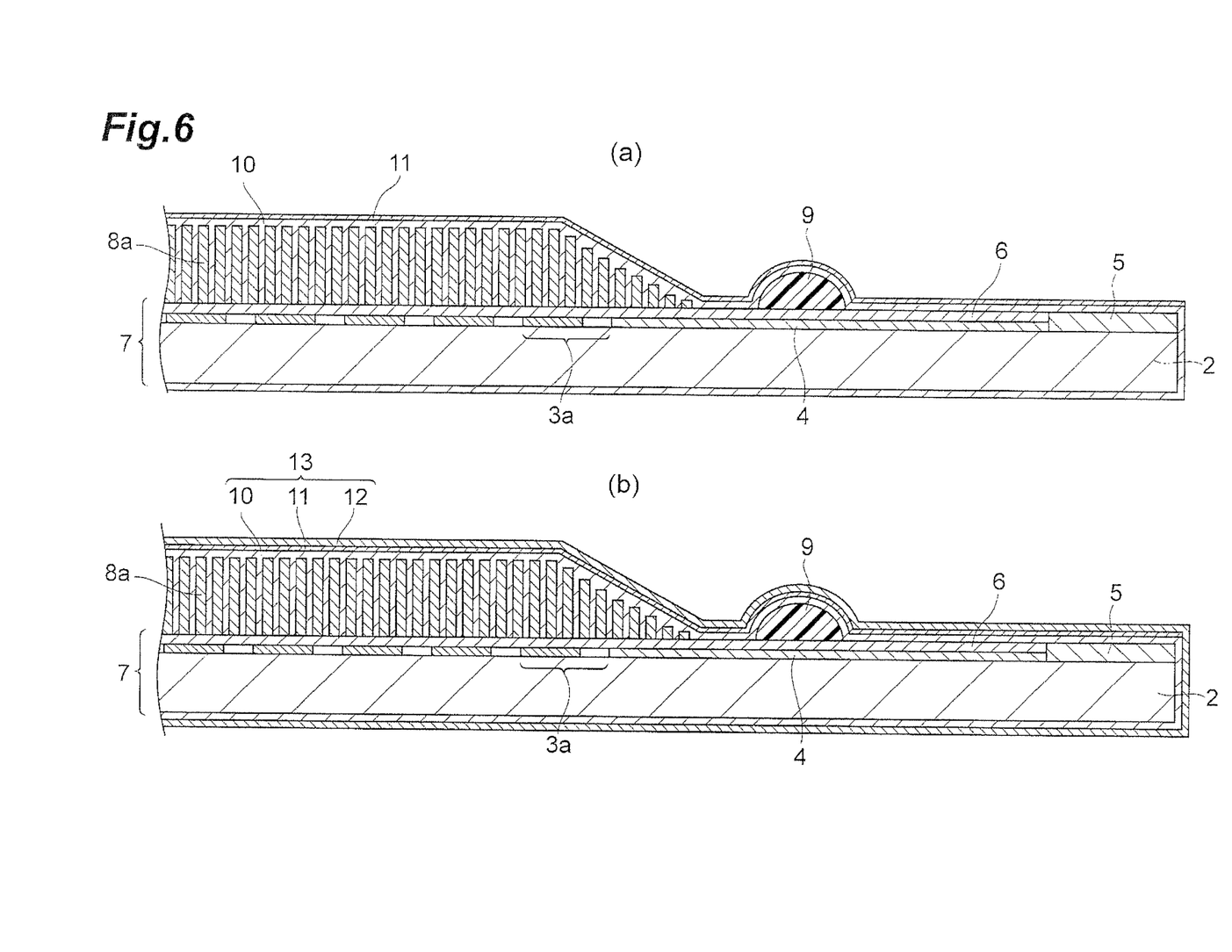
FIG. 6 is cross-sectional views showing (a) a state after formation of an inorganic film and (b) a state after formation of a second organic film in steps of producing the radiation detector of FIG. 1.

Subsequently, as shown in FIG. 6(a), an Al film 0.2 μm thick is stacked by evaporation on the surface of the first organic film 10 on the incidence surface side where radiation is incident (the face on the side where the scintillator layer 8 of the radiation detector 1 is formed), thereby forming the inorganic film (metal film) 11. Next, the entire surface of the substrate with the inorganic film 11 formed thereon is coated with poly-para-xylylene in the thickness of 5 to 23 μm, again by the CVD method. This forms the second organic film 12, as shown in FIG. 6(b). The second organic film 12 functions to prevent deterioration of the inorganic film 11 due to corrosion. The above process forms the protection film 13. The portion of the protection film 13 outside a substantially central portion of the resin frame 9 (i.e., the portion covering the bonding pads 5) is removed by a subsequent process. For this reason, the first organic film 10 and second organic film 12 do not always have to be formed on the side faces of the photoelectric conversion element array 7 and on the surface opposite to the side where the scintillator layer 8 is stacked on the photoelectric conversion element array 7.

Figure 7:
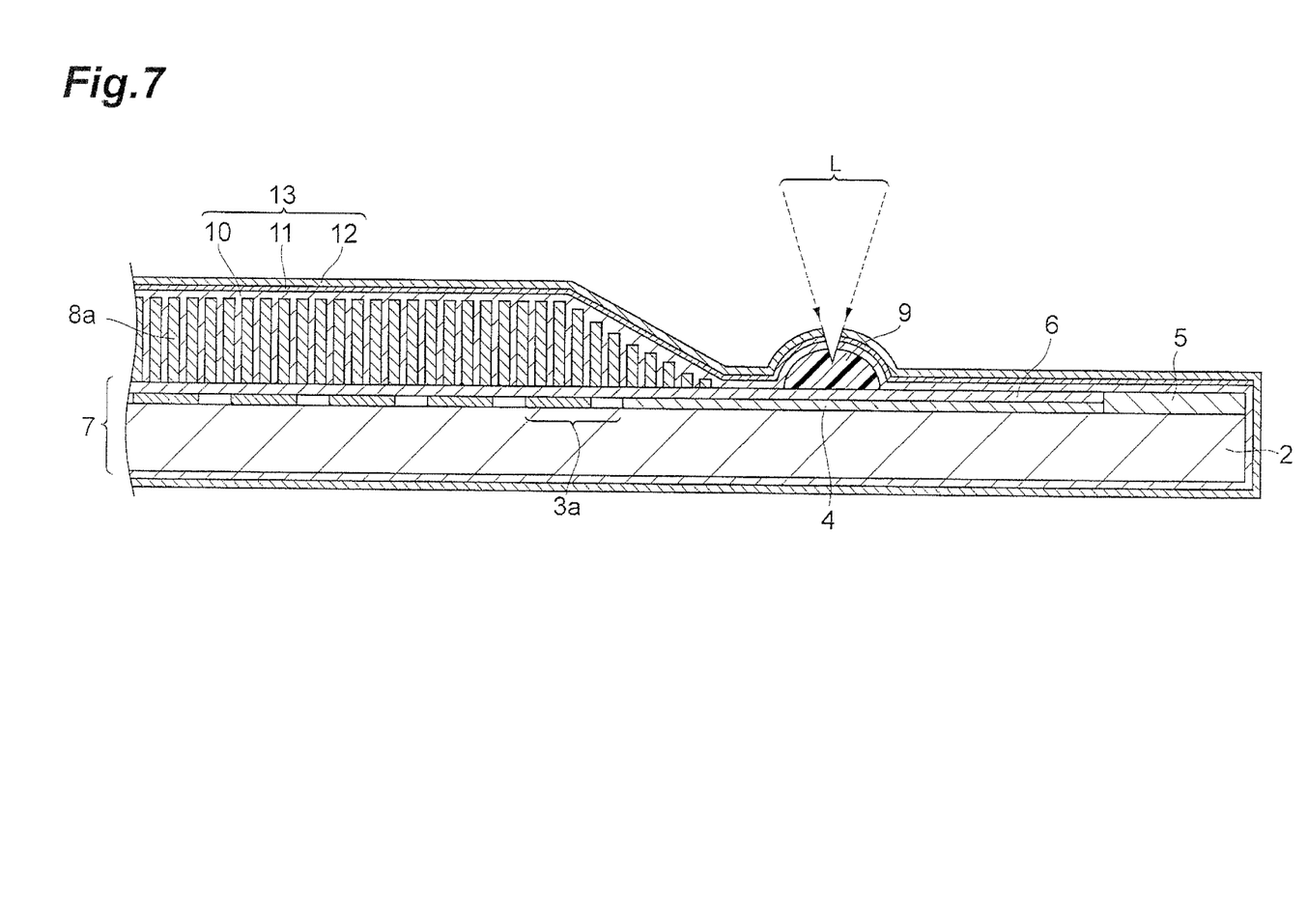
FIG. 7 is a cross-sectional view showing a processing process with a laser beam in a step of producing the radiation detector of FIG. 1.

Subsequently, as shown in FIG. 7, the protection film 13 is irradiated along the resin frame 9 with a laser beam L to cut the protection film 13. Specifically, a laser beam head (not shown) for the irradiation with the laser beam L is moved relative to a stage (not shown) carrying the whole substrate with the protection film 13 formed on the surface, whereby the surface is scanned along the resin frame 9 with the laser beam L in a manner of writing with a single stroke. More specifically, the scanning with the laser beam L is carried out along the substantially central portion (the thickest portion) of the resin frame 9. This can suppress the adverse effect of the laser beam on the photoelectric conversion element array 7 below the resin frame 9.

In this regard, it is necessary to reduce scanning speed near the corners of the resin frame 9, in order to change over scanning directions of the laser beam L. Irradiance levels with the laser beam are larger at positions on the resin frame 9 where the scanning speed is reduced, so as to make depths of the groove 9a larger. This raises a problem of making more significant the adverse effect of the laser beam on the photoelectric conversion element array 7 below the resin frame 9. In the present embodiment, however, the scanning with the laser beam L is carried out in such a manner that the outer edge 13a of the protection film 13 and the groove 9a are formed in the arcuate shape (so-called R shape) convex outward at the corners, as shown in FIG. 3; for this reason, the corners can be processed without need for decrease in reduction rate of the scanning speed with the laser beam. L at the corners, or, without need for reduction in scanning speed of the laser beam L. This can suppress the adverse effect of the laser beam on the photoelectric conversion element array 7 below the resin frame 9.

When the scanning with the laser beam L is carried out along the resin frame 9 in the manner of writing with a single stroke, the surface is doubly irradiated with the laser at a start position and an end position of the laser irradiation. For this reason, the groove 9a of the resin frame 9 becomes deeper there, which raises a possibility of exerting a serious adverse effect on the photoelectric conversion element array 7 below the resin frame 9. In the present embodiment, however, the irradiation position, irradiation intensity, etc. of the laser beam L are controlled so that the depth d3 of the groove 9a made by a single irradiation process with the laser beam L is not more than one third of the height d1 of the resin frame 9. Thanks to this, even with double laser irradiation processes at the same position, the depth of the groove 9a is not increased too large, thereby preventing the serious adverse effect from being exerted on the photoelectric conversion element array 7 below the resin frame 9.

Figure 8:
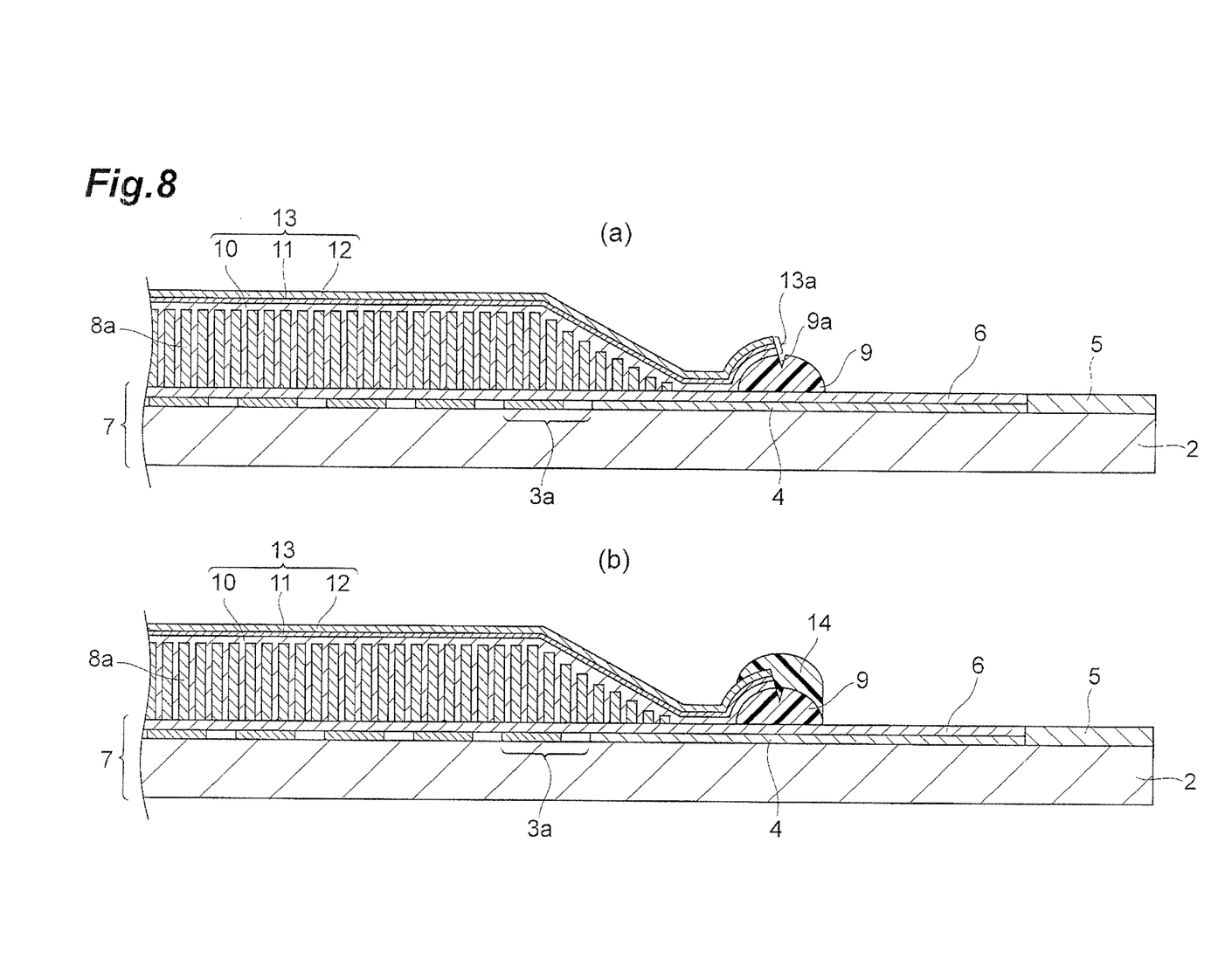
FIG. 8 is cross-sectional views showing (a) a state after cutting of a protection film and (b) a state after formation of a coating resin layer in steps of producing the radiation detector of FIG. 1.

Subsequently, as shown in FIG. 8(a), the portion of the protection film 13 outside the cut part with the laser beam L (including the portion on the opposite side to the incidence surface) is removed, thereby exposing the bonding pads 5. Then, as shown in FIG. 8(b), a coating of a coating resin such as ultraviolet-curable acrylic resin is formed along the resin frame 9 so as to cover the outer edge 13a of the protection film 13 and the resin frame 9. Thereafter, the coating resin is cured by ultraviolet irradiation to form the coating resin layer 14.

It is noted that, even without the coating resin layer 14, the protection film 13 adheres tightly to the photoelectric conversion element array 7 through the resin frame 9. However, as the coating resin layer 14 is formed, the protection film 13 including the first organic film 10 is fixed as sandwiched between the resin frame 9 and the coating resin layer 14, which further improves the adhesion of the protection film 13 onto the photoelectric conversion element array 7. Therefore, the scintillators 8a are hermetically enclosed by the protection film 13, which can securely prevent water from penetrating into the scintillators 8a, so as to prevent degradation of resolution of the elements resulting from deterioration of the scintillators 8a due to absorption of moisture.

The operation of the radiation detector 1 according to the present embodiment will be described below with reference to FIGS. 1 and 2. X-rays (radiation) incident from the incidence surface side penetrate through the protection film 13 to reach the scintillators 8a. The X-rays are absorbed by the scintillators 8a and each scintillator 8a radiates light proportional to a dose of X-rays. Of the radiated light, light traveling opposite to the direction of incidence of the X-rays is reflected by the inorganic film 11. For this reason, almost all of the light generated by the scintillators 8a is incident to the photoelectric conversion elements 3a through the passivation film 6. Each of the photoelectric conversion elements 3a generates an electric signal corresponding to a quantity of incident light through photoelectric conversion, and stores the signal for a fixed period. The quantity of light corresponds to the dose of incident X-rays. Namely, the electric signal stored in each photoelectric conversion element 3a corresponds to the dose of incident X-rays. Therefore, these electric signals yield image signals corresponding to an X-ray image. The image signals stored in the photoelectric conversion elements 3a are sequentially read out through the signal lines 4 from the bonding pads 5 to be transferred to the outside. The transferred image signals are processed by a predetermined processing circuit, whereby the X-ray image is displayed.

In the radiation detector 1 described above, the protection film 13 on the resin frame 9 is cut (or processed) with the laser beam. Since the processing with the laser beam requires no proficient technique in comparison with the cutting with the cutter, it can improve productivity. Since the protection film 13 can be cut more accurately with the laser light than by hand work, the resin frame 9 can be made smaller. Since the resin frame 9 is formed away from the scintillator layer 8 and bonding pads 5, the adverse effect of the laser beam on the scintillator layer 8 and bonding pads 5 during production can be suppressed. On the other hand, the resin frame 9 is arranged as close to the scintillator layer 8 as possible, thereby achieving an increase in effective area of the scintillator layer 8. Therefore, the radiation detector 1 can achieve both of the reduction in size of the device (radiation detection device including the radiation detector 1) and the increase in effective area of the scintillator layer 8 and improve productivity.

In the method for producing the radiation detector 1 according to the present embodiment, the protection film 13 on the resin frame 9 is cut with the laser beam, which requires no proficient technique in comparison with the cutting with the cutter and which thus improves productivity. Since the protection film 13 can be accurately cut with the laser beam, the resin frame 9 can be made smaller. As the resin frame 9 is formed away from the scintillator layer 8 and bonding pads 8, it is feasible to suppress the adverse effect of the laser beam on the scintillator layer 8 and bonding pads 5 during the cutting of the protection film 13. On the other hand, as the resin frame 9 is formed close to the scintillator layer 8, the increase in effective area of the scintillator layer 8 is also achieved.

The present invention has been described above in detail on the basis of the embodiment thereof. However, the present invention is by no means intended to be limited to the above embodiment. The present invention can he modified in many ways without departing from the spirit and scope of the invention. For example, in the above description, the protection film. 13 was described as one with the structure in which the inorganic film 11 was sandwiched between the poly-para-xylylene organic films 10, 12, but the first organic film 10 and the second organic film 12 may be made of different materials. If the inorganic film 11 is made using a corrosion-resistant material, the second organic film 12 itself may be excluded. The above described the light receiving unit 3 in the structure in which the plurality of photoelectric conversion elements 3a were two-dimensionally arrayed, but the light receiving unit 3 may be one in a structure in which a plurality of photoelectric conversion elements 3a are one-dimensionally arrayed. Furthermore, there are cases where the bonding pads 5 are formed on three sides, instead of the two sides, of the rectangular radiation detector 1. In the above embodiment, the method of laser processing by movement of the laser beam head was described, but the resin frame 9 and protection film 13 may be laser-processed by moving the stage carrying the radiation detector 1.

REFERENCE SIGNS LIST

1 radiation detector; 2 substrate; 3 light receiving unit; 3a photoelectric conversion elements; 4 signal lines; 5 bonding pads; 6 passivation film; 7 photoelectric conversion element array; 8 scintillator layer; 8a scintillators; 8b peripheral portion; 9 resin frame; 9a groove (corresponding region); 10 first organic film; 11 inorganic film (metal film); 12 second organic film; 13 protection film; 13a outer edge of protection film 13; 14 coating resin layer; D1 first distance; D2 second distance; d, d1, and d3 heights; d2 width; E1 inner edge of resin frame 9; E2 outer edge of resin frame 9; E3 outer edge of scintillator layer 8; E4 outer edge of photoelectric conversion element array 7.

The invention claimed is:

1. A method for producing a radiation detector, comprising:
    preparing a photoelectric conversion element array having a light receiving unit including a plurality of photoelectric conversion elements one-dimensionally or two-dimensionally arrayed, and a plurality of bonding pads electrically connected to the photoelectric conversion elements and arranged outside the light receiving unit, and stacking a scintillator layer for converting radiation into light, on the photoelectric conversion element array that covers the light receiving unit;
    forming a resin frame on the photoelectric conversion element array, when viewed from a stacking direction of the scintillator layer, that passes between the scintillator layer and the bonding pads away from the scintillator layer and the bonding pads and that surrounds the scintillator layer;
    forming a protection film that covers an entire surface at least on a side where the scintillator layer is stacked on the photoelectric conversion element array;
    cutting the protection film and a portion of the resin frame by scanning along a substantially central portion of the resin frame with a laser beam in a manner of writing with a single stroke to irradiate the protection film and the portion of the resin frame with the laser beam, thereby removing an outside portion of the protection film and forming a groove at the substantially central portion of the resin frame,
    wherein a ratio of a distance between an outer edge of the resin frame and an outer edge of the photoelectric conversion array to a distance between an inner edge of the resin frame and an outer edge of the scintillator layer is at least 5.

2. The method for producing a radiation detector according to claim 1, wherein the scanning with the laser beam is carried out by moving a laser beam head for outputting the laser beam.

3. The method for producing a radiation detector according to claim 1, wherein the scanning with the laser beam is carried out by moving a stage for carrying the photoelectric conversion element array.

4. The method for producing a radiation detector according to claim 1, wherein the distance between the inner edge of the resin frame and the outer edge of the scintillator layer is 1 mm or less.

5. The method for producing a radiation detector according to claim 1, wherein the distance between the outer edge of the resin frame and the outer edge of the photoelectric conversion array is at least 5 mm.

* * * * *

UNITED STATES PATENT AND TRADEMARK OFFICE
CERTIFICATE OF CORRECTION

PATENT NO.        : 10,571,581 B2
APPLICATION NO.   : 15/982771
DATED             : February 25, 2020
INVENTOR(S)       : Syouji Kurebayashi Page 1 of 1

It is certified that error appears in the above-identified patent and that said Letters Patent is hereby corrected as shown below:

On the Title Page

The Assignee "HAMAMASTSU PHOTONICS K.K." should read --HAMAMATSU PHOTONICS K.K.--.

Signed and Sealed this
Twenty-first Day of April, 2020

Andrei Iancu
*Director of the United States Patent and Trademark Office*